United States Patent
Kim et al.

(10) Patent No.: US 9,349,989 B2
(45) Date of Patent: May 24, 2016

(54) ORGANIC LUMINESCENCE EMITTING DISPLAY DEVICE AND METHOD OF MANUFACTURING THE SAME

(71) Applicant: Samsung Display Co., Ltd., Yongin, Gyeonggi-Do (KR)

(72) Inventors: Hun Kim, Yongin (KR); Jin-Woo Park, Yongin (KR)

(73) Assignee: Samsung Display Co., Ltd., Giheung-Gu, Yongin-si, Gyeonggi-Do (KR)

( * ) Notice: Subject to any disclaimer, the term of this patent is extended or adjusted under 35 U.S.C. 154(b) by 0 days.

(21) Appl. No.: 14/134,945

(22) Filed: Dec. 19, 2013

(65) Prior Publication Data

US 2014/0217380 A1    Aug. 7, 2014

(30) Foreign Application Priority Data

Feb. 7, 2013  (KR) .................. 10-2013-0014127

(51) Int. Cl.
  *H01L 29/08*  (2006.01)
  *H01L 51/52*  (2006.01)

(52) U.S. Cl.
  CPC ........ *H01L 51/5259* (2013.01); *H01L 51/5253* (2013.01)

(58) Field of Classification Search
  CPC .................. H01L 51/5253; H01L 51/5259
  USPC ............................................. 257/40
  See application file for complete search history.

(56) References Cited

U.S. PATENT DOCUMENTS

| 7,722,929 | B2  |     | 5/2010  | Aitken et al. |              |
|-----------|-----|-----|---------|---------------|--------------|
| 7,829,147 | B2  |     | 11/2010 | Aitken et al. |              |
| 8,598,786 | B1  | *   | 12/2013 | Kim ...........| H01L 51/5253 |
|           |     |     |         |               | 257/40       |
| 2007/0171637 | A1 | * | 7/2007 | Choi ..........| H01L 51/5237 |
|           |     |     |         |               | 362/227      |
| 2011/0156578 | A1 | * | 6/2011 | Jeon ..........| H01L 51/5253 |
|           |     |     |         |               | 313/506      |
| 2012/0032201 | A1 | * | 2/2012 | Chou ..........| G09F 9/301   |
|           |     |     |         |               | 257/88       |
| 2013/0230665 | A1 | * | 9/2013 | Park ..........| H01L 51/5253 |
|           |     |     |         |               | 427/535      |

FOREIGN PATENT DOCUMENTS

WO    2008156762  A1    12/2008

* cited by examiner

Primary Examiner — Vongsavanh Sengdara
(74) Attorney, Agent, or Firm — Robert E. Bushnell, Esq.

(57) ABSTRACT

An organic light emitting display apparatus including an organic light-emitting unit formed on a substrate; a moisture absorbing layer formed on the organic light-emitting unit; and at least one inorganic layer, which is formed on the moisture absorbing layer and includes a low temperature viscosity transition (LVT) inorganic material.

24 Claims, 5 Drawing Sheets

ORGANIC LUMINESCENCE EMITTING DISPLAY DEVICE AND METHOD OF MANUFACTURING THE SAME

CLAIM OF PRIORITY

This application makes reference to, incorporates the same herein, and claims all benefits accruing under 35 U.S.C. §119 from an application for ORGANIC LUMINESCENCE EMITTING DISPLAY DEVICE AND METHOD OF MANUFACTURING THE SAME, earlier filed in the Korean Intellectual Property Office on Feb. 7, 2013 and there duly assigned Serial No. 10-2013-0014127.

BACKGROUND OF THE INVENTION

1. Field of the Invention

The present invention relates to an organic luminescence emitting display device and a method of manufacturing the same.

2. Description of the Related Art

An organic light emitting display apparatus is a self-luminescent apparatus that features wide viewing angle, excellent contrast, short response time, has excellent characteristics regarding brightness, driving voltage, and response speed, and is capable of emitting varied colors. The organic light emitting display apparatus may include an organic light-emitting unit which includes a bottom electrode, an organic layer, and a top electrode. The organic light-emitting unit is highly vulnerable to external environments, such as oxygen and moisture. Therefore, an encapsulation structure for encapsulating the organic light-emitting unit from external environments.

Meanwhile, development(s) of a slim-type organic light emitting display apparatus and/or a flexible organic light emitting display apparatus is/are also still demanded.

SUMMARY OF THE INVENTION

The present invention provides an organic light emitting display apparatus including a thin-film encapsulating layer that prevents oxidization of an organic light-emitting unit and a method of manufacturing the same.

According to an aspect of the present invention, there is provided an organic light emitting display apparatus including an organic light-emitting unit formed on a substrate; a moisture absorbing layer formed on the organic light-emitting unit; and at least one inorganic layer, which is formed on the moisture absorbing layer and includes a low temperature viscosity transition (LVT) inorganic material.

The LVT inorganic material includes a tin oxide.

The LVT inorganic material further includes at least one from among a phosphor oxide, boron phosphate, a tin fluoride, a niobium oxide, and a tungsten oxide.

The LVT inorganic material includes SnO; SnO and $P_2O_5$; SnO and $BPO_4$; SnO, $SnF_2$, and $P_2O_5$; SnO, $SnF_2$, $P_2O_5$ and NbO; or SnO, $SnF_2$, $P_2O_5$ and $WO_3$.

The moisture absorbing layer includes a metal having same or greater reactivity as that of the metal included in a top electrode of the organic light-emitting unit.

The moisture absorbing layer includes at least one of Mg and Ca.

The moisture absorbing layer includes at least one of MgO and CaO.

At least one inorganic layer including the LVT inorganic material is further arranged between the organic light-emitting unit and the moisture absorbing layer.

The organic light emitting display apparatus further includes a barrier layer between the organic light-emitting unit and the moisture absorbing layer.

The barrier layer includes at least one inorganic layer containing at least one of an oxide and a nitride.

The barrier layer includes at least one from among $SiO_x$, $Al_2O_3$, zinc tin oxide (ZTO), Ga-doped zinc oxide (GZO), Al-doped zinc oxide (AZO), silicon oxynitride (SiON), and $SiN_x$.

According to another aspect of the present invention, there is provided a method of manufacturing an organic light emitting display apparatus, the method including forming an organic light-emitting unit on a substrate; forming a moisture absorbing layer on the organic light-emitting unit; and forming at least one inorganic layer, which includes a low temperature viscosity transition (LVT) inorganic material, on the moisture absorbing layer.

The forming of the inorganic layer includes forming a pre-inorganic layer including the LVT inorganic material by providing the LVT inorganic material onto the organic light-emitting unit; and healing the pre-inorganic layer at a temperature equal to or higher than the temperature for viscosity transition of the LVT inorganic material.

The temperature for viscosity transition of the LVT inorganic material is the lowest temperature at which the LVT inorganic material obtains fluidity.

The temperature for viscosity transition of the LVT inorganic material is lower than the denaturation temperature of a material included in the organic light-emitting unit.

The LVT inorganic material is provided via thermal evaporation, sputtering, vacuum deposition, cold deposition, electron beam coating, or ion plating.

The healing operation is performed by thermally treating the pre-inorganic layer at a temperature equal to or higher than the temperature for viscosity transition of the LVT inorganic material and lower than the denaturation temperature of the material included in the organic light-emitting unit.

The healing is performed under vacuum atmosphere or an inert gas atmosphere.

The moisture absorbing layer is formed via thermal evaporation, sputtering, vacuum deposition, cold deposition, electron beam coating, or ion plating.

The moisture absorbing layer includes a metal having same or greater reactivity as that of the metal included in a top electrode of the organic light-emitting unit.

The moisture absorbing layer includes at least one of Mg and Ca.

The moisture absorbing layer includes at least one of MgO and CaO.

The method further includes forming at least one auxiliary inorganic layer including the LVT inorganic material between the organic light-emitting unit and the moisture absorbing layer, wherein the forming of the auxiliary inorganic layer includes forming an auxiliary pre-inorganic layer including the LVT inorganic material on the organic light-emitting unit by providing the LVT inorganic material onto the organic light-emitting unit; forming a pre-inorganic layer including the LVT inorganic material on the moisture absorbing layer by providing the LVT inorganic material onto the moisture absorbing layer; and healing the auxiliary pre-inorganic layer and the pre-inorganic layer together at a temperature equal to or higher than the temperature for viscosity transition of the LVT inorganic material.

The method further includes forming a barrier layer between the organic light-emitting unit and the moisture absorbing layer.

The barrier layer includes at least one inorganic layer containing at least one of an oxide and a nitride.

The barrier layer includes at least one from among $SiO_x$, $Al_2O_3$, zinc tin oxide (ZTO), Ga-doped zinc oxide (GZO), Al-doped zinc oxide (AZO), silicon oxynitride (SiON), and $SiN_x$.

The barrier layer is formed via thermal evaporation, sputtering, vacuum deposition, cold deposition, electron beam coating, or ion plating.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
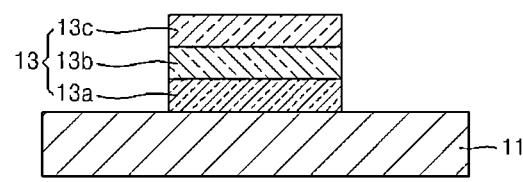
FIGS. 1 through 4 are schematic diagrams sequentially showing a method of manufacturing an organic light emitting display apparatus according to an embodiment of the present invention.

As used herein, the term "and/or" includes any and all combinations of one or more of the associated listed items. Expressions such as "at least one of," when preceding a list of elements, modify the entire list of elements and do not modify the individual elements of the list.

Hereinafter, the present invention will be described in detail by explaining preferred embodiments of the invention with reference to the attached drawings.

In the description of the present invention, certain detailed explanations of related art are omitted when it is deemed that they may unnecessarily obscure the essence of the invention. In the drawings, the thicknesses of layers and regions are exaggerated for clarity.

Like reference numerals in the drawings denote like elements throughout. While such terms as "first," "second," etc., may be used to describe various components, such components must not be limited to the above terms. It will also be understood that when a layer is referred to as being "on" another layer or substrate, it can be directly on the other layer or substrate, or intervening layers may also be present.

FIGS. 1 through 4 are schematic diagrams sequentially showing a method of manufacturing an organic light emitting display apparatus according to an embodiment of the present invention.

First, a substrate 11 is provided. The substrate 11 may be a substrate used in a common organic light emitting display apparatus, where a glass substrate or a transparent plastic substrate that features excellent mechanical strength, thermal stability, transparency, surface planarity, ease of handling, and waterproofness. Meanwhile, if the organic light emitting display apparatus is a top emission type in which light is emitted in a direction opposite to the substrate 11, the substrate 11 may not be transparent and may also be a metal substrate or a carbon fiber substrate other than a glass substrate or a plastic substrate. If the organic light emitting display apparatus is a flexible display apparatus, the substrate 11 may be a bendable flexible substrate formed of a polyimide film.

A organic light-emitting unit 13 is formed on the substrate 11. The organic light-emitting unit 13 may have a structure in which a bottom electrode 13a, an organic layer 13b, and a top electrode 13c are stacked on the substrate 11 in the order stated.

The bottom electrode 13a may be formed by providing a bottom electrode material onto the substrate 11 via deposition method or sputtering method. If the bottom electrode 13a is an anode, the bottom electrode material may be selected from among materials having high work functions for ease of hole injection. According to type of the organic light emitting display apparatus, the bottom electrode 13a may be a reflective electrode, a semi-transmissive electrode, or a transmissive electrode. The bottom electrode material may include transparent materials having excellent conductivity, such as indium tin oxide (ITO), indium zinc oxide (IZO), tin oxide ($SnO_2$), and zinc oxide ($ZnO_2$). Alternatively, the bottom electrode 13a may be formed as a reflective electrode by using magnesium (Mg), aluminum (Al), aluminum-lithium (Al—Li), calcium (Ca), magnesium-indium (Mg—In), or magnesium-silver (Mg—Ag).

The bottom electrode 13a may have a single-layer structure or a multi-layer structure including two or more layers. For example, the bottom electrode 13a may have a triple layer structure of ITO/Ag/ITO. However, the present invention is not limited thereto.

The organic layer 13b is formed on the bottom electrode 13a.

The organic layer 13b may include one or more layers from among a hole injection layer, a hole transport layer, a functional layer that may function as both a hole injection layer and a hole transport layer, a buffer layer, an electron stopping layer, a light-emitting layer, a hole stopping layer, an electron transport layer, and an electron injection layer.

The organic layer 13b may include one or more from among chemical compounds 301, 311, and 321 as shown below, for example.

[Chemical Compound 1]

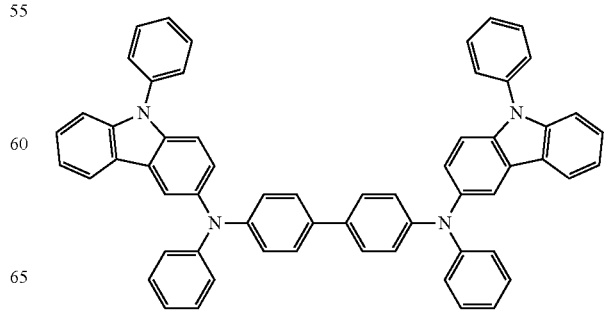

301

-continued

[Chemical Compound 2]

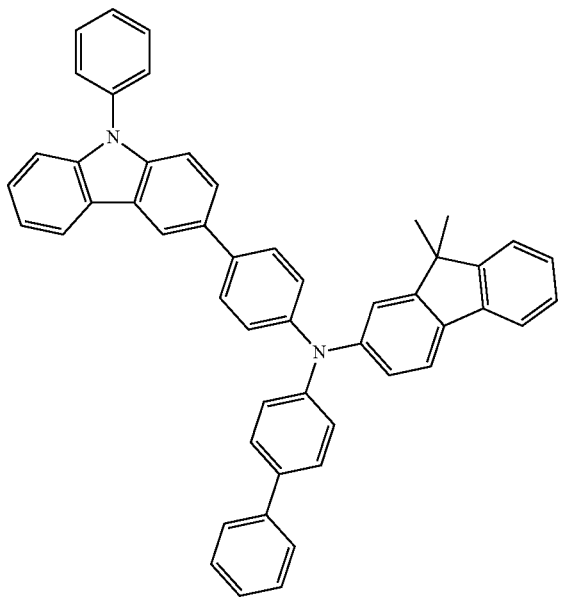

311

[Chemical Compound 3]

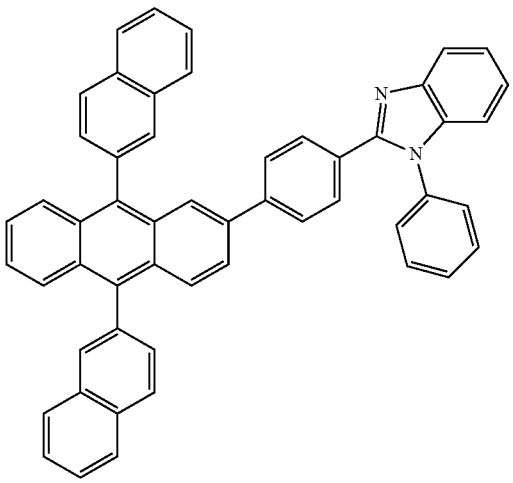

321

The top electrode 13c is formed on the organic layer 13b. The top electrode 13c may be a cathode, which is an electron injecting electrode. Here, a top electrode material may be a metal, an alloy, an electrically conductive compound with small work functions, or a mixture thereof. In detail, a reflective electrode, a semi-transmissive electrode, or a transmissive electrode may be obtained by forming a thin-film using lithium (Li), Mg, Al, Al—Li, Ca, Mg—In, or Mg—Ag. Furthermore, various modifications may be made herein, e.g., forming a transmissive electrode using ITO and IZO for a top emission type organic light emitting display apparatus.

Although not shown in FIG. 1, in the organic light-emitting unit 13, each pixel includes a pixel circuit, and the pixel circuit may include at least one thin-film transistor (TFT) and a capacitor (not shown). The bottom electrode 13a may be electrically connected to the TFT.

The bottom electrode 13a may be patterned in each of pixels, whereas the top electrode 13c may be formed as a common electrode to cover all pixels.

In a bottom emission type organic light emitting display apparatus in which an image is embodied in a direction toward the substrate 11, the top electrode 13c may be formed to have a relatively large thickness to improve light-emitting efficiency in the direction toward the substrate 11.

In a top emission type organic light emitting display apparatus in which an image is embodied in a direction toward the top electrode 13c, the top electrode 13c may be formed to have a sufficiently small thickness to be a semi-transmissive reflective layer or the top electrode 13c may be formed of a transparent conductor other than the materials stated above. In the case of the latter, the bottom electrode 13a may further include a reflective layer.

Although not shown in FIG. 1, a protection layer may be formed on the top electrode 13c. The protection layer is to prevent the top electrode 13c from being damaged during formation of a thin-film encapsulating layer 20 on the organic light-emitting unit 13 and may be formed of LiF, lithium quinolate, aluminum tris(8-hydroxyquinoline) ($Alq_3$).

Figure 2:
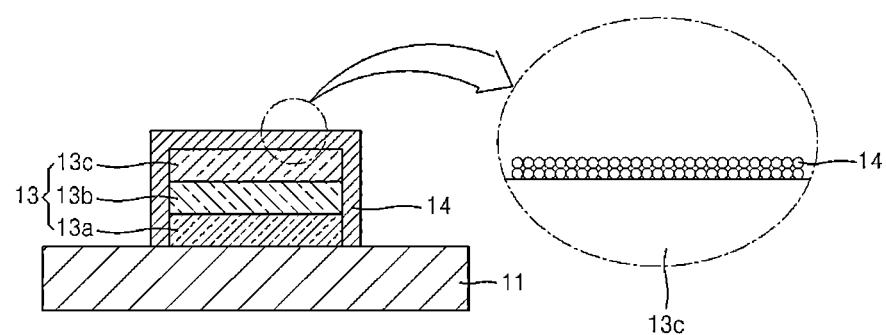

Next, referring to FIG. 2, the thin-film encapsulating layer 20 is formed on the organic light-emitting unit 13. According to an embodiment of the present invention, the thin-film encapsulating layer 20 includes a moisture absorbing layer 14 and an inorganic layer 16b.

First, the moisture absorbing layer 14 is formed on the organic light-emitting unit 13.

The moisture absorbing layer 14 is a layer for preventing oxidization of the top electrode 13c and the organic layer 13b. The moisture absorbing layer 14 reacts with external moisture or oxygen and prevents introduction of the external moisture or oxygen into the organic light-emitting unit 13. Therefore, the moisture absorbing layer 14 includes a material that is highly reactive with moisture and oxygen. In detail, the moisture absorbing layer 14 includes a metal having same or greater reactivity as that of the metal included in the top electrode 13c. Here, the term reactivity refers to the tendency that a metal reacts with moisture and oxygen and is oxidized. If the organic light emitting display apparatus is a top emission type, the top electrode 13c may be formed of Mg—Ag. In this case, the moisture absorbing layer 14 include at least one of Mg and Ca. However, in this case, the moisture absorbing layer 14 may further include a metal with high reactivity, such as potassium (K) or sodium (Na).

The moisture absorbing layer 14 may be formed via thermal evaporation, sputtering, vacuum deposition, cold deposition, electron beam coating, or ion plating. Here, the thermal evaporation refers to a method for evaporating a source by applying heat generated by electric resistance and depositing the source to a target object. The sputtering refers to a method for forming a thin-film via sputtering. The other methods are also known in the art, and thus detailed descriptions thereof will be omitted.

The moisture absorbing layer 14 is formed as a uniform layer to completely cover the organic light-emitting unit 13. In case of a top emission type organic light emitting display apparatus, the moisture absorbing layer 14 may be formed as a thin-film having a thickness from several nanometers to dozens of nanometers to not to interfere light transmission. Since Mg and Ca are not transparent materials, light efficiency may be deteriorated if thickness of the moisture absorbing layer 14 is larger than the thickness above.

However, in case of a bottom emission type organic light emitting display apparatus, the moisture absorbing layer 14 may be formed to have a larger thickness and may have a thickness from hundreds of nanometers to several micrometers to improve moisture absorbance.

At least one inorganic layer 16b including a low-temperature viscosity transition (LVT) inorganic material is formed on the moisture absorbing layer 14.

Figure 3:
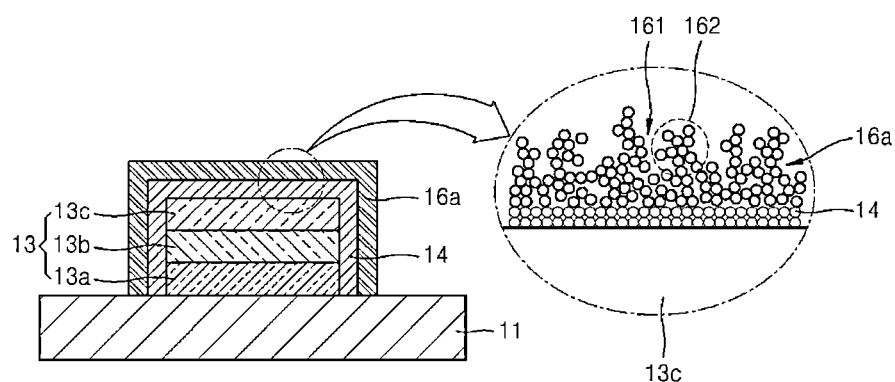

In detail, a pre-inorganic layer 16a including a LVT inorganic material as shown in FIG. 3 is formed by providing the LVT inorganic material onto the moisture absorbing layer 14.

The LVT inorganic material is an inorganic material featuring a low temperature for viscosity transition.

Here, the "temperature for viscosity transition" refers to not a temperature at which viscosity of the LVT inorganic material completely transits from "solid" to "liquid," but the lowest temperature at which the LVT inorganic material has any degree of fluidity.

The temperature for viscosity transition of the LVT inorganic material may be lower than denaturation temperature of a material included in the organic light-emitting unit 13. The denaturation temperature refers to a temperature at which chemical and/or physical denaturation of a material included in the organic light-emitting unit 13 may be induced. For example, the "denaturation temperature of the material included in the organic light-emitting unit 13" may refer to the glass transition temperature Tg of an organic material included in the organic layer 13b of the organic light-emitting unit 13. The glass transition temperature Tg may be obtained based on a result of performing a thermal analysis using a thermo gravimetric analysis (TGA) and differential scanning calorimetry (DSC) ($N_2$ atmosphere, Temperature Range: room temperature ~600° C. (10° C./min) (TGA) and room temperature ~400° C. (DSC), Pan Type Pt Pan in disposable Al Pan (TGA) and disposable pan (DSC) as is obvious to one of ordinary skill in the art.

The denaturation temperature of the material included in the organic light-emitting unit 13 may exceed about 130° C., for example. However, the present invention is not limited thereto, and the denaturation temperature of the material included in the organic light-emitting unit 13 may be easily measured via the TGA analysis as described above.

For example, the temperature for viscosity transition of the LVT inorganic material may be about 80° C. or higher, e.g., from about 80° C. to 130° C. However, the present invention is not limited thereto. For example, the temperature for viscosity transition of the LVT inorganic material may be from about 80° C. to 120° C. or from about 100° C. to 120° C. However, the present invention is not limited thereto.

The LVT inorganic material may include one compound or be a mixture of two or more compounds.

The LVT inorganic material may include a tin oxide (e.g., SnO or $SnO_2$).

If the LVT inorganic material includes SnO, content of the SnO may be from 20 weight % to 100 weight %.

For example, the LVT inorganic material may further include one or more from among a phosphor oxide (e.g., $P_2O_5$), boron phosphate ($BPO_4$), a tin fluoride (e.g., $SnF_2$), a niobium oxide (e.g., NbO), and a tungsten oxide (e.g., $WO_3$). However, the present invention is not limited thereto.

For example, the LVT inorganic material may include
SnO;
SnO and $P_2O_5$;
SnO and $BPO_4$;
SnO, $SnF_2$, and $P_2O_5$;
SnO, $SnF_2$, $P_2O_5$, and NbO; or
SnO, $SnF_2$, $P_2O_5$, and $WO_3$. However, the present invention is not limited thereto.

For example, the LVT inorganic material may have one from among compositions stated below. However, the present invention is not limited thereto.
SnO (100 wt %);
SnO (80 wt %), and $P_2O_5$ (20 wt %);
SnO (90 wt %), and $BPO_4$ (10 wt %);
4) SnO (20-50 wt %), $SnF_2$ (30-60 wt %), and $P_2O_5$ (10-30 wt %) (here, the sum of weights of SnO, $SnF_2$, and $P_2O_5$ is 100 wt %);
5) SnO (20-50 wt %), $SnF_2$ (30-60 wt %), $P_2O_5$ (10-30 wt %), and NbO (1-5 wt %) (here, the sum of weights of SnO, $SnF_2$, $P_2O_5$, and NbO is 100 wt %); or
6) SnO (20-50 wt %), $SnF_2$ (30-60 wt %), $P_2O_5$ (10-30 wt %), and $WO_3$ (1-5 wt %) (here, the sum of weights of SnO, $SnF_2$, $P_2O_5$, and $WO_3$ is 100 wt %).

For example, the LVT inorganic material may include SnO (42.5 wt %), $SnF_2$ (40 wt %), $P_2O_5$ (15 wt %), and $WO_3$ (2.5 wt %). However, the present invention is not limited thereto.

The formation of the pre-inorganic layer 16a by providing the LVT inorganic material onto the organic light-emitting unit 13 may be performed via thermal evaporation, sputtering, vacuum deposition, cold deposition, electron beam coating, or ion plating.

For example, the LVT inorganic material may be provided via plasma enhanced chemical vapor deposition (PCVD) or plasma ion assisted deposition (PIAD). However, the present invention is not limited thereto.

According to an embodiment of the present invention, a LVT inorganic material having a composition of SnO—$SnF_2$—$P_2O_5$—$WO_3$ may be provided onto the organic light-emitting unit 13 via sputtering. In detail, dual rotary target type sputtering is applied, and the substrate 11 may be scanned while being moved. Here, argon plasma of about 12 kw and about 0.4 Pa may be used, and the pre-inorganic layer 16a having a desired thickness (e.g., about 1 μm) via a plurality of times of scanning.

As shown in FIG. 1B, the pre-inorganic layer 16a may include defects, such as a LVT inorganic material film forming element 162 and a pin hole 161.

The LVT inorganic material film forming element 162 refers to condensed LVT inorganic material particles that did not contribute to formation of a LVT inorganic material film formation, whereas the pin hole 161 refers to a region in which the moisture absorbing layer 14 is exposed due to absence of the LVT inorganic material. The formation of the LVT inorganic material film forming element 162 may contribute to the formation of the pin hole 161.

The defects of the pre-inorganic layer 16a as described above may become paths in which external environmental substances, such as moisture and oxygen, pass during storage and driving of an organic light emitting display apparatus, thereby causing progressive dark spots. Therefore, lifespan of an organic light emitting display apparatus may be deteriorated.

Figure 4:
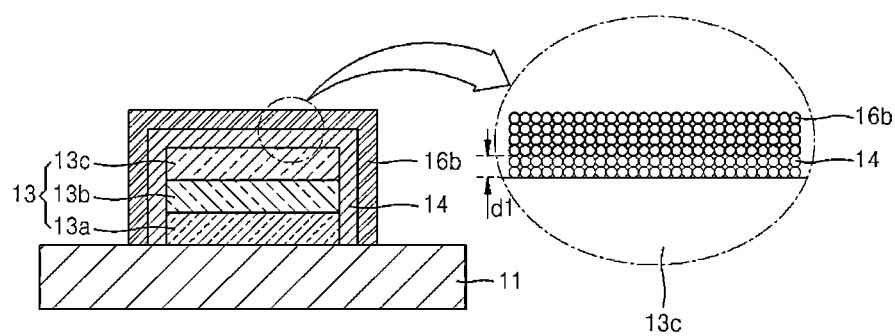

Therefore, after the pre-inorganic layer 16a is formed as shown in FIG. 4, a healing operation for removing defects of the pre-inorganic layer 16a is performed.

The healing operation is performed at a temperature equal to or higher than the temperature for viscosity transition of the LVT inorganic material. For example, the healing operation may be performed by thermally treating the pre-inorganic layer 16a at a temperature that is equal to or higher than the temperature for viscosity transition of the LVT inorganic material and lower than the denaturation temperature of a material included in the organic light-emitting unit 13. The "temperature for viscosity transition of the LVT inorganic material" varies according to compositions of the LVT inorganic material, and the "denaturation temperature of the material included in the organic light-emitting unit 13" varies according to the material included in the organic light-emitting unit 13. However, the temperatures stated above are obvious to one of ordinary skill in the art based on the composition of the LVT inorganic material and the material included in the organic light-emitting unit 13 (e.g., Tg temperature evaluation based on TGA analysis on the material included in the organic light-emitting unit 13).

For example, the healing operation may be performed by thermally treating the pre-inorganic layer 16a at a temperature from about 80° C. to about 130° C. for from about 1 hour to about 3 hours (e.g., at 110° C. for 2 hours). However, the present invention is not limited thereto. By performing the healing operation at a temperature within the range as described above, the LVT inorganic material of the pre-inorganic layer 16a may be fluidized and denaturation of the organic light-emitting unit 13 may be prevented.

The healing operation may be performed in an IR oven under vacuum atmosphere or inert gas atmosphere (e.g., $N_2$ atmosphere, Ar atmosphere, etc.) to prevent the moisture absorbing layer 14 and the organic light-emitting unit 13 from being exposed to external environments via the pin hole 161 of the pre-inorganic layer 16a.

Due to the healing operation, the LVT inorganic material included in the pre-inorganic layer 16a may be fluidized. The fluidized LVT inorganic material may have flowability. Therefore, during the healing operation, the fluidized LVT inorganic material may flow into the pin hole 161 of the pre-inorganic layer 16a and fill the pin hole 161, and the LVT inorganic material film forming element 162 may be fluidized, flow into the pin hole 161, and fill the pin hole 161.

As a result, defects of the pre-inorganic layer 16a may be removed, and thus the dense inorganic layer 16b may be formed.

Thickness of the inorganic layer 16b may be from about 1 μm to about 30 μm, e.g., from about 1 μm to about 5 μm. Here, if the thickness of the inorganic layer 16b is from about 1 μm to about 5 μm, a bendable flexible organic light emitting display apparatus may be embodied. Furthermore, the inorganic layer 16b may be formed as a thin-film as described above, thereby contributing embodiment of a flexible organic light emitting display apparatus. Therefore, an organic light emitting display apparatus that features long lifespan and flexibility may be embodied.

Figure 5:
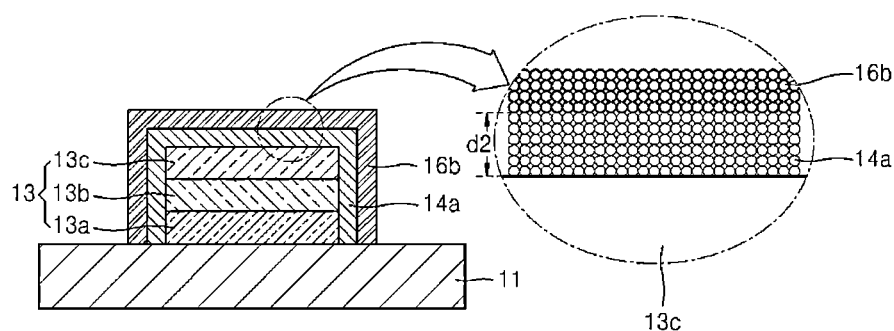
FIG. 5 is a schematic view of an organic light emitting display apparatus according to another embodiment of the present invention.

FIG. 5 is a schematic view of an organic light emitting display apparatus according to another embodiment of the present invention.

In the embodiment shown in FIG. 5, the moisture absorbing layer 14 includes a metal oxide having reactivity same as or greater than that of a metal included in the top electrode 13c, as compared to the previous embodiment. Hereinafter, to distinguish from the moisture absorbing layer 14 of FIG. 4, a moisture absorbing layer according to the embodiment shown in FIG. 5 will be referred to as a moisture absorbing layer a 14a.

If the organic light emitting display apparatus is a top emission type, an upper electrode may be formed of a metal thin-film, such as a Mg—Ag thin-film. In this case, the moisture absorbing layer a 14a includes at least one of a magnesium oxide (e.g., MgO) and a calcium oxide (CaO). However, the present invention is not limited thereto, and the moisture absorbing layer a 14a ay further include a metal oxide having high reactivity, such as a potassium oxide (e.g., $K_2O$) or a sodium oxide (e.g., $Na_2O$).

If an organic light emitting display apparatus is a top emission type, the moisture absorbing layer a 14a of FIG. 5 may have a greater thickness than the moisture absorbing layer 14 of FIG. 4. Thickness d2 of the moisture absorbing layer a 14a of FIG. 5 is greater than thickness d1 of the moisture absorbing layer 14 of FIG. 4. The moisture absorbing layer a 14a of FIG. 5 includes a metal oxide, thereby featuring excellent light transmittance. However, the moisture absorbing layer 14 of FIG. 4 includes a metal, thereby featuring relatively poor light transmittance. Furthermore, since a metal features excellent reflectivity, thickness of the moisture absorbing layer 14 of FIG. 4 is limited if an organic light emitting display apparatus is a top emission type. However, the moisture absorbing layer a 14a may have any of various thicknesses. Therefore, the moisture absorbing layer a 14a may have a relatively large thickness, thereby featuring excellent absorbance of moisture and oxygen.

Figure 6:
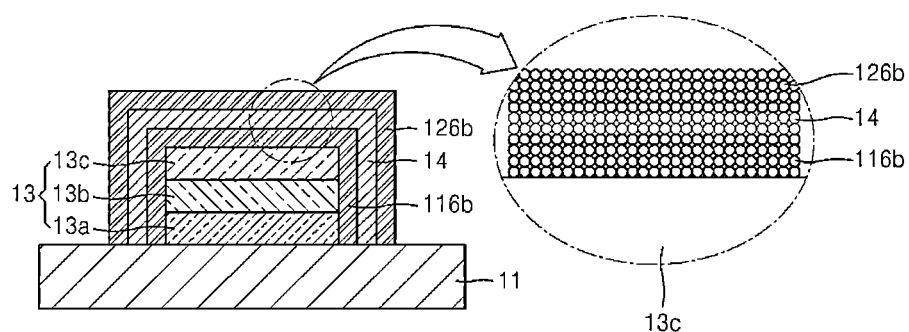
FIG. 6 is a schematic view of an organic light emitting display apparatus according to another embodiment of the present invention.

FIG. 6 is a schematic view of an organic light emitting display apparatus according to another embodiment of the present invention.

In the embodiment shown in FIG. 6, at least one inorganic layer including the LVT inorganic material is further arranged between the organic light-emitting unit 13 and the moisture absorbing layer 14. In other words, a thin-film encapsulating layer according to the embodiment of FIG. 6 includes an inorganic layer/a moisture absorbing layer/an inorganic layer.

In other words, in the embodiment shown in FIG. 6, an inorganic layer including the LVT inorganic material is formed on the organic light-emitting unit 13, the moisture absorbing layer 14 is formed thereon, and another inorganic layer including the LVT inorganic material is formed on the moisture absorbing layer 14. Hereinafter, to distinguish the inorganic layers, the inorganic layer formed on the organic light-emitting unit 13 will be referred to as a first inorganic layer 116b, whereas the inorganic layer formed on the moisture absorbing layer 14 will be referred to as a second inorganic layer 126b.

In the embodiment shown in FIG. 6, a first pre-inorganic layer (not shown) including a LVT inorganic material is formed on the organic light-emitting unit 13 by providing the LVT inorganic material onto the organic light-emitting unit 13. Since the LVT inorganic material is described above in detail with reference to FIGS. 3 and 4, detailed description thereof will be omitted below. As described above, the first pre-inorganic layer may include defects, such as a LVT inorganic material film forming element and a pin hole. However, after the first pre-inorganic layer is formed, a healing operation for removing the defects of the first pre-inorganic layer is not performed immediately.

Next, the moisture absorbing layer 14 is formed on the first pre-inorganic layer. As in the embodiment shown in FIG. 4, the moisture absorbing layer 14 may include a metal (e.g., Mg, Ca, etc.) having a reactivity same as or greater than that of a metal included in a top electrode.

However, the present invention is not limited thereto. The moisture absorbing layer 14 may also include a metal oxide (e.g., MgO, CaO, etc.) having a reactivity same as or greater than that of the metal included in the top electrode. Furthermore, the moisture absorbing layer 14 may be a mixture of metals, such as Mg and Ca, and metal oxides, e.g., MgO and CaO.

Next, a second pre-inorganic layer including a LVT inorganic material is formed by providing the LVT inorganic material onto the moisture absorbing layer 14. As described, above, the second pre-inorganic layer may include defects, such as a LVT inorganic material film forming element and a pin hole.

Next, a healing operation for removing the defects of the first pre-inorganic layer and the second pre-inorganic layer is performed. The healing operation is performed at a temperature equal to or higher than the temperature for viscosity transition of the LVT inorganic material.

The healing operation may be performed in an IR oven under vacuum atmosphere or inert gas atmosphere (e.g., $N_2$ atmosphere, Ar atmosphere, etc.) to prevent the organic light-emitting unit 13 from being exposed to external environments via the pin hole 161 of the pre-inorganic layer 16a.

Due to the healing operation, the fluidized LVT inorganic material may flow into the pin holes of the first and second pre-inorganic layers and fill the pin holes, and the LVT inorganic material film forming element may be fluidized, flow into the pin holes, and fill the pin holes. As a result, as shown in FIG. 6, defects of the first and second pre-inorganic layers may be removed, and thus the dense first and second inorganic layers 116b and 126b may be formed. According to the embodiment shown in FIG. 6, the overall operation may be simplified by performing a single healing operation after the different inorganic layers 116b and 126b are formed.

However, the present invention is not limited thereto. A first healing operation may be performed after the first pre-inorganic layer is formed, and a second healing operation may be performed after the second pre-inorganic layer is formed.

As shown in FIG. 6, since the first inorganic layer 116b and the organic light-emitting unit 13 directly contact each other and attachment between the first inorganic layer 116b and the organic light-emitting unit 13 may be improved via a healing operation, a high quality organic light emitting display apparatus may be embodied.

Figure 7:
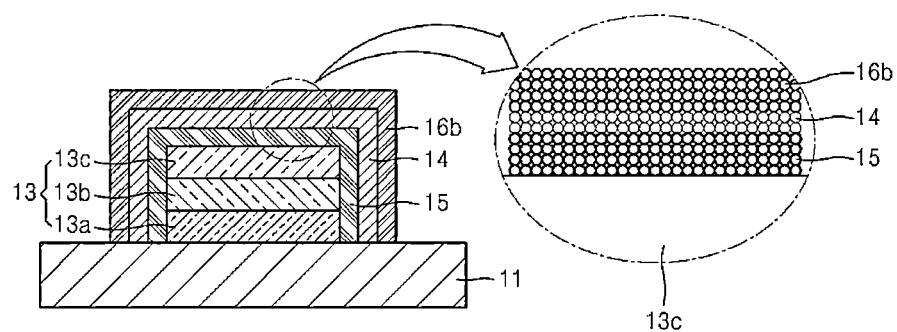
FIG. 7 is a schematic view of an organic light emitting display apparatus according to another embodiment of the present invention.
Figure 8:
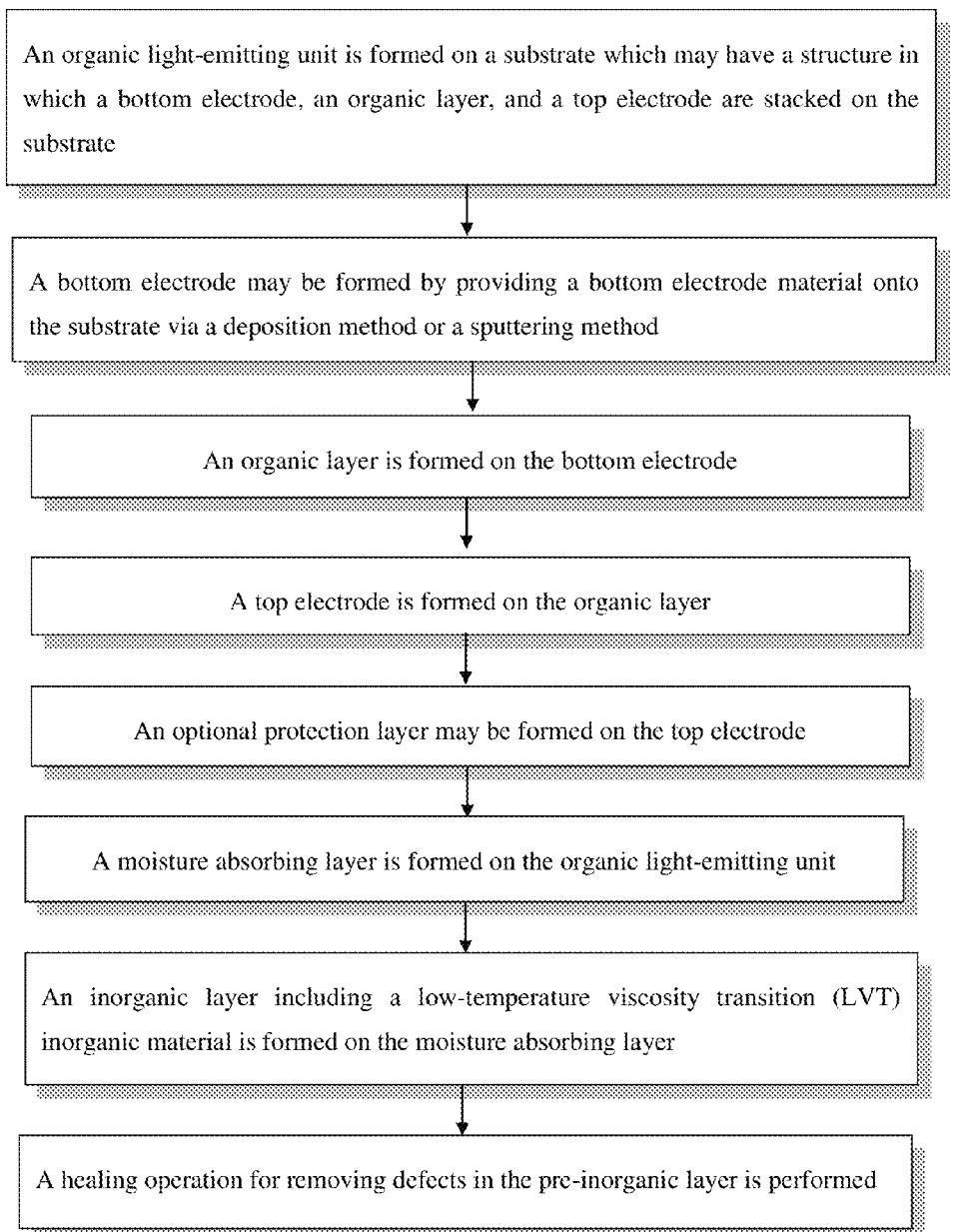
FIG. 8 is a flow chart showing one embodiment of a general method of manufacturing an organic light-emitting display of the present invention.

FIG. 7 is a schematic view of an organic light emitting display apparatus according to another embodiment of the present invention.

In the embodiment shown in FIG. 7, a barrier layer 15 is further formed between the organic light-emitting unit 13 and the moisture absorbing layer 14. A thin-film encapsulating layer according to the embodiment of FIG. 7 includes a barrier layer/a moisture absorbing layer/a barrier layer.

The barrier layer 15 is a layer for preventing introduction of moisture and oxygen into the organic light-emitting unit 13. Unlike the moisture absorbing layer 14, the barrier layer 15 may barely absorb moisture and oxygen. However, since the barrier layer 15 is very dense, the barrier layer 15 is highly effective for preventing permeation of moisture and oxygen.

The barrier layer 15 may be formed of an inorganic layer including a nitride or an oxide. For example, the barrier layer 15 may include at least one from among $SiO_x$, $Al_2O_3$, zinc tin oxide (ZTO), Ga-doped zinc oxide (GZO), Al-doped zinc oxide (AZO), silicon oxynitride (SiON), and $SiN_x$. The elements are relatively dense, thereby preventing permeation of moisture and oxygen.

The barrier layer 15 may be formed via thermal evaporation, sputtering, vacuum deposition, cold deposition, electron beam coating, or ion plating.

Meanwhile, if the inorganic layer 16b including the LVT inorganic material is formed directly on the barrier layer 15, stress is formed between dense inorganic layers, and thus the interface therebetween may be peeled off or cracked. Therefore, it is necessary to arrange a thin film having excellent softness between the barrier layer 15 and the inorganic layer 16b including the LVT inorganic material. If the moisture absorbing layer 14 includes a metal, since a metal has excellent softness, the metal may reduce stress between the barrier layer 15 and the inorganic layer 16b including the LVT inorganic material. Therefore, as shown in FIG. 7, the moisture absorbing layer 14 may include a metal with high reactivity, e.g., Mg or Ca.

Meanwhile, the moisture absorbing layer a 14a as shown in FIG. 5 may be further arranged between the barrier layer 15 and the inorganic layer 16b including the LVT inorganic material. In this case, the barrier layer 15 block moisture and oxygen from the organic light-emitting unit 13, and the moisture absorbing layer a 14a may absorb the blocked moisture and oxygen. Therefore, oxidization of the organic light-emitting unit 13 may be prevented more effectively.

Although the display apparatuses in the above embodiments are organic light emitting display apparatuses including organic light emitting devices, the present invention may also be applied to other types of flat-panel display apparatuses including inorganic encapsulating thin-films.

Furthermore, although not shown, an organic layer formed of an organic material and an inorganic layer formed of an inorganic material may be alternately arranged on the inorganic layer 16b of FIGS. 4, 5, and 7 or the second inorganic layer 126b of FIG. 6 and constitute a thin-film encapsulating structure. In this case, the organic layer is formed of a polymer material and may be a single layer or multi layers including one or more from among polyethylene terephthalate, polyimide, polycarbonate, epoxy, polyethylene, and polyacrylate. In the encapsulating structure, the topmost layer of the encapsulating structure exposed to outside may be formed as an inorganic layer to prevent permeation into an organic light emitting device. The encapsulating structure may include at least one sandwiched structure in which at least one organic layer is arranged between at least two inorganic layers. Furthermore, the thin-film encapsulating structure may also include at least one sandwiched structure in which at least one inorganic layer is arranged between at least two organic layers.

For example, the thin-film encapsulating structure may include a first organic layer and a third organic layer on the inorganic layer 16b of FIGS. 4, 5, and 7 or the second inorganic layer 126b of FIG. 6 in the order stated. Furthermore, the thin-film encapsulating structure may also include a first organic layer, a third inorganic layer, a second organic layer, and a fourth inorganic layer on the inorganic layer 16b of FIGS. 4, 5, and 7 or the second inorganic layer 126b of FIG. 6 in the order stated. Furthermore, the thin-film encapsulating structure may include a first organic layer, a third inorganic layer, a second organic layer, a fourth inorganic layer, a third organic layer, and a fifth inorganic layer on the inorganic layer 16b of FIGS. 4, 5, and 7 or the second inorganic layer 126b of FIG. 6 in the order stated. Here, the first organic layer is smaller than the third inorganic layer, and the second organic layer may be smaller than the fourth inorganic layer. Furthermore, the first organic layer is completely covered by the third inorganic layer, and the second organic layer may also be completely covered by the fourth inorganic layer.

Meanwhile, an encapsulating substrate may be further adhered to the thin-film encapsulating layer via a sealing member, such as a sealant or a frit, to efficiently seal the organic light emitting device.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light emitting display apparatus comprising:
   an organic light-emitting unit comprising a top electrode and a bottom electrode disposed on a substrate;
   a moisture absorbing layer disposed on the organic light-emitting unit; and at least one inorganic layer, which is disposed on the moisture absorbing layer including a low temperature viscosity transition (LVT) inorganic material;
wherein the temperature for viscosity transition of the LVT inorganic material is lower than the denaturation temperature of a material included in the organic light-emitting unit; and
wherein the moisture absorbing layer comprises a metal having the same or greater reactivity as that of the metal included in the top electrode of the organic light-emitting unit.

2. The organic light emitting display apparatus of claim 1, wherein the LVT inorganic material comprises a tin oxide.

3. The organic light emitting display apparatus of claim 1, wherein the LVT inorganic material comprises at least one from among a phosphor oxide, boron phosphate, a tin fluoride, a niobium oxide, or a tungsten oxide.

4. The organic light emitting display apparatus of claim 1, wherein the LVT inorganic material comprises:
SnO;
SnO and $P_2O_5$;
SnO and $BPO_4$;
SnO, $SnF_2$, and $P_2O_5$;
SnO, $SnF_2$, $P_2O_5$ and NbO; or
SnO, $SnF_2$, $P_2O_5$ and $WO_3$.

5. The organic light emitting display apparatus of claim 1, wherein the moisture absorbing layer comprises at least one of Mg or Ca.

6. The organic light emitting display apparatus of claim 1, wherein the moisture absorbing layer comprises at least one of MgO or CaO.

7. The organic light emitting display apparatus of claim 1, wherein at least one additional inorganic layer including the LVT inorganic material is further arranged between the organic light-emitting unit and the moisture absorbing layer.

8. The organic light emitting display apparatus of claim 1, further comprising a barrier layer between the organic light-emitting unit and the moisture absorbing layer.

9. The organic light emitting display apparatus of claim 8, wherein the barrier layer comprises at least one inorganic layer containing at least one of an oxide or a nitride.

10. The organic light emitting display apparatus of claim 9, wherein the barrier layer comprises at least one from among $SiO_x$, $Al_2O_3$, zinc tin oxide (ZTO), Ga-doped zinc oxide (GZO), Al-doped zinc oxide (AZO), silicon oxynitride (SiON), or $SiN_x$.

11. A method of manufacturing an organic light emitting display apparatus, the method comprising:
forming an organic light-emitting unit comprising a top electrode and a bottom electrode on a substrate;
forming a moisture absorbing layer on the organic light-emitting unit; and
forming at least one inorganic layer, which includes a low temperature viscosity transition (LVT) inorganic material, on the moisture absorbing layer;
wherein the temperature for viscosity transition of the LVT inorganic material is lower than the denaturation temperature of a material included in the organic light-emitting unit; and
wherein the moisture absorbing layer comprises a metal having the same or greater reactivity as that of the metal included in a top electrode of the organic light-emitting unit.

12. The method of claim 11, wherein the forming of the inorganic layer comprises:
forming a pre-inorganic layer including the LVT inorganic material by providing the LVT inorganic material onto the organic light-emitting unit; and
healing the pre-inorganic layer at a temperature equal to or higher than the temperature for viscosity transition of the LVT inorganic material.

13. The method of claim 12, wherein the temperature for viscosity transition of the LVT inorganic material is the lowest temperature at which the LVT inorganic material has a degree of fluidity.

14. The method of claim 12, wherein the LVT inorganic material is provided via thermal evaporation, sputtering, vacuum deposition, cold deposition, electron beam coating, or ion plating.

15. The method of claim 12, wherein the healing operation is performed by thermally treating the pre-inorganic layer at a temperature equal to or higher than the temperature for viscosity transition of the LVT inorganic material and lower than the denaturation temperature of the material included in the organic light-emitting unit.

16. The method of claim 12, wherein the healing is performed under vacuum atmosphere or an inert gas atmosphere.

17. The method of claim 11, wherein the moisture absorbing layer is formed by thermal evaporation, sputtering, vacuum deposition, cold deposition, electron beam coating, or ion plating.

18. The method of claim 11, wherein the moisture absorbing layer comprises at least one of Mg or Ca.

19. The method of claim 11, wherein the moisture absorbing layer comprises at least one of MgO or CaO.

20. A method of claim 11, further comprising forming at least one auxiliary inorganic layer including the LVT inorganic material between the organic light-emitting unit and the moisture absorbing layer,
wherein the forming of the auxiliary inorganic layer comprises:
forming an auxiliary pre-inorganic layer including the LVT inorganic material on the organic light-emitting unit by providing the LVT inorganic material onto the organic light-emitting unit;
forming a pre-inorganic layer including the LVT inorganic material on the moisture absorbing layer by providing the LVT inorganic material onto the moisture absorbing layer; and
healing the auxiliary pre-inorganic layer and the pre-inorganic layer together at a temperature equal to or higher than the temperature for viscosity transition of the LVT inorganic material.

21. The method of claim 11, further comprising forming a barrier layer between the organic light-emitting unit and the moisture absorbing layer.

22. The method of claim 21, wherein the barrier layer comprises at least one inorganic layer containing at least one of an oxide or a nitride.

23. The method of claim 21, wherein the barrier layer comprises at least one from among $SiO_x$, $Al_2O_3$, zinc tin oxide (ZTO), Ga-doped zinc oxide (GZO), Al-doped zinc oxide (AZO), silicon oxynitride (SiON), or $SiN_x$.

24. The method of claim 21, wherein the barrier layer is formed by thermal evaporation, sputtering, vacuum deposition, cold deposition, electron beam coating, or ion plating.

* * * * *